US008735253B2

(12) United States Patent
Kronholz et al.

(10) Patent No.: US 8,735,253 B2
(45) Date of Patent: May 27, 2014

(54) ADJUSTING OF A NON-SILICON FRACTION IN A SEMICONDUCTOR ALLOY DURING TRANSISTOR FABRICATION BY AN INTERMEDIATE OXIDATION PROCESS

(75) Inventors: Stephan Kronholz, Dresden (DE); Vassilios Papageorgiou, Austin, TX (US); Martin Trentzsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 667 days.

(21) Appl. No.: 12/707,918

(22) Filed: Feb. 18, 2010

(65) Prior Publication Data
US 2010/0221883 A1 Sep. 2, 2010

(30) Foreign Application Priority Data
Feb. 27, 2009 (DE) .......................... 10 2009 010 883

(51) Int. Cl.
| H01L 21/336 | (2006.01) |
| H01L 21/8238 | (2006.01) |
| H01L 29/10 | (2006.01) |
| H01L 29/66 | (2006.01) |
| H01L 21/8234 | (2006.01) |

(52) U.S. Cl.
CPC . *H01L 21/823807* (2013.01); *H01L 21/823412* (2013.01); *H01L 29/1054* (2013.01); *H01L 29/66636* (2013.01)
USPC ...................................................... 438/285

(58) Field of Classification Search
CPC ............... H01L 21/823807; H01L 21/823412; H01L 29/1054; H01L 29/66636
USPC ................................................... 438/285
See application file for complete search history.

(56) References Cited

U.S. PATENT DOCUMENTS

| 4,975,387 | A | * | 12/1990 | Prokes et al. | 438/486 |
| 5,212,110 | A | * | 5/1993 | Pfiester et al. | 438/222 |
| 5,268,324 | A | * | 12/1993 | Aitken et al. | 438/217 |
| 5,521,108 | A | * | 5/1996 | Rostoker et al. | 438/260 |
| 6,008,077 | A | * | 12/1999 | Maeda | 438/151 |
| 6,054,719 | A | * | 4/2000 | Fusser et al. | 257/14 |
| 6,059,895 | A | * | 5/2000 | Chu et al. | 148/33.1 |
| 6,339,232 | B1 | * | 1/2002 | Takagi | 257/192 |
| 6,369,438 | B1 | * | 4/2002 | Sugiyama et al. | 257/616 |
| 6,492,216 | B1 | * | 12/2002 | Yeo et al. | 438/197 |

(Continued)

OTHER PUBLICATIONS

Translation of Official Communication from German Patent Office for German Patent Application No. 10 2009 010 883.1-33 dated Mar. 25, 2010.

*Primary Examiner* — Mary Wilczewski
(74) *Attorney, Agent, or Firm* — Amerson Law Firm, PLLC

(57) ABSTRACT

The concentration of a non-silicon species in a semiconductor alloy, such as a silicon/germanium alloy, may be increased after a selective epitaxial growth process by oxidizing a portion of the semiconductor alloy and removing the oxidized portion. During the oxidation, preferably the silicon species may react to form a silicon dioxide material while the germanium species may be driven into the remaining semiconductor alloy, thereby increasing the concentration thereof. Consequently, the threshold adjustment of sophisticated transistors may be accomplished with enhanced process uniformity on the basis of a given parameter setting for the epitaxial growth process while nevertheless providing a high degree of flexibility in adjusting the composition of the threshold adjusting material. In other cases, in addition to or alternatively to forming a threshold adjusting semiconductor alloy, a strain-inducing semiconductor alloy may also be provided with enhanced flexibility using the above-described process sequence.

27 Claims, 6 Drawing Sheets

(56) References Cited

U.S. PATENT DOCUMENTS

| | | | |
|---|---|---|---|
| 6,512,252 B1* | 1/2003 | Takagi et al. | 257/192 |
| 6,600,212 B2* | 7/2003 | Takayanagi et al. | 257/616 |
| 6,607,948 B1* | 8/2003 | Sugiyama et al. | 438/151 |
| 6,621,114 B1* | 9/2003 | Kim et al. | 257/310 |
| 6,743,680 B1* | 6/2004 | Yu | 438/285 |
| 6,746,943 B2* | 6/2004 | Takayanagi et al. | 438/587 |
| 6,924,181 B2* | 8/2005 | Huang et al. | 438/197 |
| 7,022,593 B2* | 4/2006 | Arena et al. | 438/494 |
| 7,060,632 B2* | 6/2006 | Fitzgerald et al. | 438/767 |
| 7,109,099 B2* | 9/2006 | Tan et al. | 438/527 |
| 7,148,130 B2* | 12/2006 | Miyano | 438/509 |
| 7,198,997 B2* | 4/2007 | Shiono et al. | 438/197 |
| 7,205,210 B2* | 4/2007 | Barr et al. | 438/455 |
| 7,241,647 B2* | 7/2007 | Sadaka et al. | 438/149 |
| 7,282,402 B2* | 10/2007 | Sadaka et al. | 438/221 |
| 7,348,259 B2* | 3/2008 | Cheng et al. | 438/458 |
| 7,365,362 B2* | 4/2008 | Miyano | 257/65 |
| 7,470,591 B2* | 12/2008 | O'Meara et al. | 438/287 |
| 7,501,318 B2* | 3/2009 | Bedell et al. | 438/151 |
| 7,524,740 B1* | 4/2009 | Liu et al. | 438/479 |
| 7,557,018 B2* | 7/2009 | Nakaharai et al. | 438/479 |
| 7,759,228 B2* | 7/2010 | Sugiyama et al. | 438/479 |
| 7,825,493 B2* | 11/2010 | Ikeda | 257/616 |
| 7,829,916 B2* | 11/2010 | Morand et al. | 257/192 |
| 7,892,927 B2* | 2/2011 | Monfray et al. | 438/285 |
| 7,972,971 B2* | 7/2011 | Damlencourt et al. | 438/758 |
| 8,043,929 B2* | 10/2011 | Brunner et al. | 438/407 |
| 8,048,791 B2* | 11/2011 | Hargrove et al. | 438/591 |
| 8,110,486 B2* | 2/2012 | Matsumoto et al. | 438/509 |
| 8,232,186 B2* | 7/2012 | Harley et al. | 438/507 |
| 8,293,596 B2* | 10/2012 | Kronholz et al. | 438/199 |
| 8,324,119 B2* | 12/2012 | Reichel et al. | 438/791 |
| 2002/0011617 A1* | 1/2002 | Kubo et al. | 257/301 |
| 2002/0130393 A1* | 9/2002 | Takayanagi et al. | 257/616 |
| 2003/0013305 A1* | 1/2003 | Sugii et al. | 438/689 |
| 2003/0207555 A1* | 11/2003 | Takayanagi et al. | 438/590 |
| 2004/0195623 A1* | 10/2004 | Ge et al. | 257/347 |
| 2005/0003229 A1* | 1/2005 | Bedell et al. | 428/641 |
| 2005/0139961 A1* | 6/2005 | Brunner et al. | 257/616 |
| 2005/0215071 A1* | 9/2005 | Moriceau et al. | 438/770 |
| 2005/0221591 A1* | 10/2005 | Bedell et al. | 438/479 |
| 2006/0040433 A1* | 2/2006 | Sadaka et al. | 438/151 |
| 2006/0214257 A1* | 9/2006 | Ninomiya et al. | 257/502 |
| 2006/0281234 A1* | 12/2006 | Sugiyama et al. | 438/151 |
| 2007/0077701 A1 | 4/2007 | O'Meara et al. | 438/240 |
| 2007/0090467 A1* | 4/2007 | Zhu | 257/390 |
| 2007/0111474 A1* | 5/2007 | Delattre et al. | 438/459 |
| 2007/0128840 A1* | 6/2007 | Chen et al. | 438/493 |
| 2007/0207598 A1* | 9/2007 | Damlencourt et al. | 438/479 |
| 2008/0020532 A1* | 1/2008 | Monfray et al. | 438/285 |
| 2008/0149988 A1* | 6/2008 | Kinoshita et al. | 257/315 |
| 2010/0213553 A1* | 8/2010 | Hargrove et al. | 257/410 |
| 2010/0221883 A1* | 9/2010 | Kronholz et al. | 438/285 |
| 2010/0289094 A1* | 11/2010 | Reichel et al. | 257/409 |
| 2012/0108039 A1* | 5/2012 | Zojaji et al. | 438/492 |
| 2012/0156864 A1* | 6/2012 | Kronholz et al. | 438/492 |
| 2012/0280289 A1* | 11/2012 | Flachowsky et al. | 257/288 |
| 2012/0282763 A1* | 11/2012 | Kronholz et al. | 438/492 |

\* cited by examiner

ADJUSTING OF A NON-SILICON FRACTION IN A SEMICONDUCTOR ALLOY DURING TRANSISTOR FABRICATION BY AN INTERMEDIATE OXIDATION PROCESS

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity compared to conventional gate dielectrics, such as silicon dioxide and silicon nitride.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a gate insulation layer that separates the gate electrode, frequently comprised of polysilicon or other materials, from the silicon channel region. In steadily improving device performance of field effect transistors, the length of the channel region has continuously been decreased to improve switching speed and drive current capability. Since the transistor performance is controlled by the voltage supplied to the gate electrode, to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current for the required increased capacitive coupling of the gate electrode to the channel region, since the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may no longer be compatible with requirements for performance driven circuits.

Therefore, replacing silicon dioxide as the material for gate insulation layers has been considered, particularly for transistors requiring extremely thin silicon dioxide gate layers. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer.

It has thus been suggested to replace silicon dioxide with high permittivity materials such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$) and the like.

When advancing to sophisticated gate architectures based on high-k dielectrics, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while maintaining leakage currents at an acceptable level. On the other hand, metal-containing non-polysilicon materials, such as titanium nitride and the like, may be formed so as to directly connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, commonly, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region so as to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll off, and also reducing significant variations of transistor performance with a variation in gate length. Since the threshold voltage of the transistors is significantly determined by the work function of the gate material that is in contact with the gate dielectric material, an appropriate adjustment of the effective work function with respect to the conductivity type of the transistor under consideration has to be guaranteed.

For example, appropriate metal-containing gate electrode materials, such as titanium nitride, aluminum oxide and the like, may frequently be used, wherein the corresponding work function may be adjusted so as to be appropriate for one type of transistor, such as N-channel transistors, while P-channel transistors may require a different work function and thus a differently treated titanium nitride material or any other appropriate metal-containing material in order to obtain the desired threshold voltage. In this case, complex and sophisticated manufacturing regimes may be required to provide different gate electrode materials in order to comply with the requirements of different transistor types. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration.

The adjustment of the band gap and thus of the threshold of sophisticated transistor elements on the basis of silicon/germanium is a promising approach for sophisticated transistor elements comprising a metal gate. Typically, the silicon/germanium material may be formed on the basis of selective epitaxial growth techniques in which process parameters may be controlled such that a significant material deposition may be restricted to crystalline silicon areas only, while a significant deposition on dielectric surface areas may be efficiently suppressed. During this epitaxial growth process, parameter values, such as flow rates of precursor gases, deposition pressure, temperature and the like, may have to be precisely controlled in order to accomplish a high degree of uniformity of the material characteristics of the silicon/germanium alloy across the entire substrate surface. For example, a delicate balance between layer thickness, lattice mismatch between the silicon/germanium alloy and the silicon material, temperature during the process and density of the deposited material may have to be maintained in order to obtain a substantially defect-free silicon/germanium alloy. Moreover, in view of appropriately adjusting the band gap of the silicon/germanium alloy in view of the desired threshold voltage, the germanium concentration and the resulting layer thickness may represent very critical parameters, which may not be adjusted independently with respect to other process parameters, while, at the same time, even minute variations in concentration and layer thickness may result in a significant threshold variability across individual die regions and also across the entire semiconductor substrate. Consequently, in sophisticated semiconductor production facilities, only a restricted number of different parameter settings may typically be applied for various semiconductor products when a silicon/germanium alloy may be required, for instance for adjusting the threshold of sophisticated transistor elements. For example, a less than desired germanium concentration may be achieved on the basis of a well-controllable and reliable manufacturing process in a sophisticated semiconductor facility, thereby significantly restricting the flexibility in adjusting the overall transistor characteristics.

It is also well known that the switching speed and the drive current capability of silicon-based field effect transistors may be increased by modifying the lattice structure in the channel region of the transistors. That is, by creating compressive or tensile strain in the channel region of the transistor, the charge carrier mobility may be increased, thereby achieving the desired increase of transistor performance. For example, a compressive strain component induced along the current flow direction of a P-channel transistor for a standard crystallographic configuration of the silicon in the channel region, i.e., a (100) surface orientation with the current flow direction being aligned along a <110> crystallographic axis, may provide a significant increase of the hole mobility. Thus, frequently, a silicon/germanium alloy may be incorporated into the drain and source areas of P-channel transistors which may thus be provided in a highly strained state due to the lattice mismatch between the silicon/germanium alloy and the surrounding silicon material, thereby also inducing corresponding compressive strain components in the adjacent channel region of the transistor. The silicon/germanium alloy may be formed in the drain and source areas by first providing appropriate cavities and re-filling the cavities on the basis of a selective epitaxial growth process, wherein the magnitude of the resulting strain component may be adjusted on the basis of a lateral offset of the cavities with respect to the channel region and the germanium concentration, which may determine the magnitude of the lattice mismatch. Also in this case, appropriate deposition recipes may typically be available in a sophisticated semiconductor facility to enable a substantially defect-free deposition of the silicon/germanium alloy with a maximum germanium concentration that may be compatible with the above-explained constraints in view of the parameter setting.

Consequently, although well-established process recipes may be available for forming a silicon/germanium alloy in a controllable manner, the available parameter settings may not provide sufficient flexibility in adjusting the overall transistor characteristics, such as threshold voltage and the like.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques for extending the capabilities of presently available well-established process recipes for forming a silicon-containing semiconductor alloy, such as a silicon/germanium alloy, for instance with respect to increasing the concentration of a non-silicon species, such as a germanium species, without contributing to increased processed non-uniformity and substantially without generating additional crystalline defects. To this end, the silicon-containing semiconductor alloy may be formed on the basis of a well-established process recipe and subsequently adjusting the concentration of the non-silicon species, for instance increasing the concentration thereof by an oxidation process in which preferably the silicon species may be consumed so as to form a corresponding oxide while the non-silicon species may be "driven" into the remaining non-oxidized portion of the previously formed semiconductor alloy. Thereafter, the oxidized portion may be selectively removed and thus a corresponding silicon-containing semiconductor alloy may be obtained with a modified concentration, substantially without contributing to additional crystal defects. Furthermore, the oxidation process as well as the selective removal may be performed with a high degree of process uniformity, thereby substantially not contributing to the overall process non-uniformity, which may substantially be determined by the initially performed epitaxial growth process. If required, a sequence of deposition of an alloy, oxidizing the same and removing the oxidized portion may be repeated one or several times to obtain a desired total thickness of the silicon-containing semiconductor alloy having the modified concentration of the non-silicon species. In other cases, at least the process of oxidizing a portion of a semiconductor alloy and selectively removing the oxidized portion may be repeated to further increase the concentration of the non-silicon species, wherein an initial layer thickness may be appropriately selectable so as to obtain a desired final thickness after removing two or more oxidized portions. In some illustrative embodiments, the adaptation of the concentration of a non-silicon species may be applied to the formation of a threshold adjusting material in order to obtain a desired band gap offset in forming sophisticated gate electrode structures on the basis of high-k dielectric materials and metal-containing electrode materials. In still other illustrative aspects disclosed herein, the increased concentration of a non-silicon species may be applied to providing a strain-inducing semiconductor alloy in the drain and source areas of transistor elements with an increased internal strain level, while not unduly contributing to an increased degree of lattice defects, such as dislocations, which may frequently be associated when increasing the contents of a non-silicon species. In still other illustrative embodiments disclosed herein, the concept of adjusting the material composition of a silicon-containing semiconductor alloy may be applied to both the threshold adjusting and the strain engineering of a transistor element, thereby providing enhanced flexibility in individually adjusting the characteristics of the various semiconductor alloys on the basis of a single well-established process recipe.

One illustrative method disclosed herein comprises forming a first layer of a silicon-containing semiconductor alloy on a silicon-containing crystalline semiconductor region, wherein the silicon-containing semiconductor alloy comprises a non-silicon species with a first concentration. The method additionally comprises forming an oxide by consuming material of the first layer of a silicon-containing semiconductor alloy while preserving a second layer of a silicon-containing semiconductor alloy on the silicon-containing semiconductor region, wherein the second layer of a silicon-containing semiconductor alloy comprises the non-silicon species with a second concentration. Furthermore, the oxide is removed from the second layer of a silicon-containing semiconductor alloy. Finally, the method comprises forming a gate electrode structure of a transistor above the second layer of a silicon-containing semiconductor alloy, wherein the gate electrode structure comprises a high-k dielectric gate insulation layer and a metal-containing gate electrode material formed above the high-k dielectric gate insulation layer.

A further illustrative method disclosed herein comprises forming a first layer of a silicon/germanium alloy on a silicon-containing semiconductor region, wherein the first layer comprises a germanium species with a first concentration. The method further comprises oxidizing a portion of the first layer of a silicon/germanium alloy so as to form a second layer of a silicon/germanium alloy, wherein the second layer comprises the germanium species with a second concentration that is higher than the first concentration. Furthermore, the portion is moved selectively to the second layer of a silicon/germanium alloy and a transistor element is formed in and on the silicon-containing semiconductor region on the basis of the second layer of a silicon/germanium alloy.

A still further illustrative method disclosed herein comprises forming a cavity in a silicon-containing semiconductor region laterally adjacent to a gate electrode structure of a transistor. The method further comprises forming a first layer of a silicon-containing semiconductor alloy in the cavity, wherein the first layer comprises a non-silicon species with a first concentration. The method additionally comprises oxidizing a portion of the first layer of a silicon-containing semiconductor alloy so as to form a second layer of a silicon-containing semiconductor alloy, wherein the second layer comprises the non-silicon species with a second concentration that is higher than the first concentration. Moreover, the method comprises forming drain and source regions in the silicon-containing semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1A:
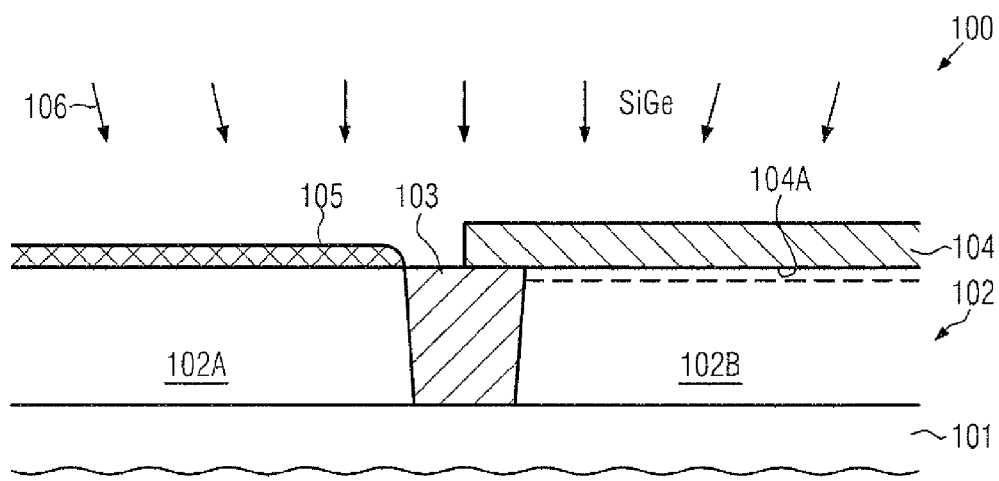
FIGS. 1a-1c schematically illustrate cross-sectional views of a semiconductor device during a process sequence for forming a silicon-containing semiconductor alloy and modifying the material composition thereof in a portion by performing an oxidation process and removing an oxidized portion, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques for forming a silicon-containing semiconductor alloy on the basis of enhanced flexibility by extending the capabilities of existing well-established recipes in that the concentration of a non-silicon species may be adjusted by performing a well-controllable oxidation process and selectively removing the oxidized portion, thereby efficiently modifying the material composition in the remaining part of the previously deposited semiconductor alloy. In some illustrative embodiments, silicon/germanium alloy may be adapted in view of the germanium concentration without unduly contributing to the overall defect rate by oxidizing a portion of the silicon/germanium alloy, for instance upon establishing an appropriate oxidation ambient, such as a dry oxidation at elevated temperatures of approximately 900° C. and above, during which the silicon species may preferably react with the oxygen, while the germanium species may be driven out of the oxidized portion thereby increasing the germanium concentration in the remaining semiconductor alloy. Since the oxidation process may be performed on the basis of well-controllable process conditions, that is, corresponding oxidation processes may be performed by using well-established parameter settings in which the resulting oxidation rate may be predicted with a high degree of reliability, the oxidation of the portion of the silicon/germanium alloy may be accomplished with a high degree of controllability and also the selective removal thereof may be performed on the basis of well-established etch techniques, for instance using diluted hydrofluoric acid (HF) and the like. Consequently, in total, based on an initial selective epitaxial growth recipe with a desired degree of process uniformity, any additional process variations may be kept at a very low level compared to epitaxial growth techniques in which the germanium concentration is to be increased, for instance, in adjusting a required band gap offset, providing a desired high strain component and the like. Consequently, a very efficient process sequence may be provided for implementing silicon/germanium alloys with a high degree of flexibility with respect to germanium concentration, layer thickness and the like on the basis of only one or a few well-established parameter settings for the complex selective epitaxial growth process, thereby reducing overall yield losses in semiconductor facilities when sophisticated semiconductor devices are to be formed. It should be appreciated that the principles disclosed herein may be efficiently applied to silicon/germanium alloys since this material mixture may frequently be used in sophisticated transistor elements. In other cases, the principles may be applied to other silicon-containing semiconductor materials in which the oxidation rate may differ for the various non-silicon species, thereby resulting in a corresponding reduction or increase of the concentration of the non-silicon species in the remaining portion of the previously formed semiconductor alloy.

FIG. 1a schematically illustrates a cross-sectional view of a semiconductor device 100 at an early manufacturing stage. As illustrated, the device 100 may comprise a substrate 101, which may represent any appropriate carrier material for forming thereabove a silicon-containing semiconductor layer 102. Furthermore, in some illustrative embodiments, the substrate 101 in combination with the semiconductor layer 102 may represent a silicon-on-insulator (SOI) configuration, when a buried insulating layer (not shown) may be provided between the semiconductor layer 102 and the substrate 101. In other cases, as illustrated, the device 100 may represent a "bulk" configuration in which the semiconductor layer 102 may represent an upper portion of a crystalline semiconductor material of the substrate 101. It should be appreciated that an SOI configuration and a bulk configuration may both be provided in the device 100 at different device areas, if considered appropriate for the overall performance and behavior of the semiconductor device 100. In the manufacturing stage shown, an appropriate isolation structure 103, for instance in the form of a shallow trench isolation, may be provided in the semiconductor layer 102, thereby defining active regions 102A, 102B, which may be understood as silicon-containing semiconductor regions in and above which at least one transistor element is to be formed. For example, in the embodiment shown, the active region 102A may represent an appropriately doped silicon-based semiconductor material for forming therein and thereabove a P-channel transistor, while the active region 102B may represent the active region of an N-channel transistor. Moreover, as illustrated, a mask layer 104 is formed above the active region 102B and may be comprised of any appropriate material, such as silicon nitride, silicon dioxide and the like, which may substantially suppress oxidation of the semiconductor region 102B or which may at least significantly reduce a corresponding oxidation rate during an oxidation process to be performed in a later manufacturing stage. For example, the mask layer 104 may comprise a silicon nitride material which may be considered as a non-oxidizable material for a plurality of oxidation atmospheres. Furthermore, if desired, the mask layer 104 may comprise one or more additional layers, such as a layer 104A, which may act as an efficient etch stop layer upon removing the mask layer 104. For example, the etch stop layer 104A may be comprised of a silicon dioxide material when the layer 104 may be provided in the form of a silicon nitride material. Moreover, a layer of a semiconductor alloy 105, such as a silicon/germanium alloy, may be formed on the active region 102A and may thus represent a portion of the active region 102A upon forming a transistor element therein in a later manufacturing stage. As previously discussed, in sophisticated process techniques for forming advanced gate electrode structures including a high-k dielectric material in combination with a metal-containing electrode material, it may be necessary to appropriately adjust the band gap offset of a channel material of the transistor, which may be accomplished on the basis of a silicon-containing semiconductor alloy, wherein a uniform thickness and a desired concentration of a non-silicon species, such as a germanium species, may be required. Since the corresponding parameters may not be compatible with the deposition capabilities of available and well-controllable selective epitaxial growth techniques, the semiconductor alloy may be provided with a specific thickness and with a germanium concentration that may comply with the available parameter setting of a corresponding deposition technique. Consequently, the semiconductor alloy 105 may be formed with a reduced degree of lattice defects, while a corresponding adaptation of the concentration of the non-silicon species contained therein, such as the germanium species, may be accomplished by subsequent well-controllable manufacturing processes in order to enhance overall uniformity of the finally obtained threshold adjusting semiconductor alloy. For example, the semiconductor alloy 105 may have a thickness of approximately 5-20 Å and may have a germanium concentration of approximately 15-25 atomic percent germanium if a silicon/germanium alloy is considered. For example, the germanium concentration may be approximately 23 atomic percent and less.

The semiconductor device 100 as illustrated in FIG. 1a may be formed on the basis of the following processes. After forming the isolation structure 103, which may be accomplished by sophisticated lithography, etch, deposition, oxidation and planarization processes, the basic doping in the active regions 102A, 102B may be established by, for instance, ion implantation using appropriate masking regimes on the basis of well-established strategies. If required, an anneal process may be performed to activate the dopants and re-crystallize implantation-induced damage. Thereafter, the mask layer 104, possibly in combination with the layer 104A, may be formed, for instance, by oxidation and/or deposition for the layer 104A and by deposition of the layer 104. For example, after forming the layer 104A, for instance in the form of a silicon dioxide material, an appropriate silicon nitride material may be deposited and may subsequently be patterned on the basis of well-established lithography techniques, wherein the layer 104A may be used as an etch stop material, for instance for maintaining integrity of the active region 102B. Thereafter, the exposed portion of the layer 104A may be removed on the basis of highly controllable etch recipes, such as hydrofluoric acid and the like, if a silicon dioxide material is considered. Next, the surface of the active region 102A may be prepared for the deposition of the layer 105, which may be accomplished by performing one or more cleaning processes in order to remove silicon oxide residues together with other contaminants and the like that may have deposited on the exposed surface portion during the preceding manufacturing processes. Next, the semiconductor device 100 may be exposed to the ambient of a selective epitaxial growth process 106 in order to provide the material 105 with a high degree of uniformity on the basis of well-established parameter settings. For instance, by selecting an appropriate substrate temperature in the range of approximately 500-800° C. and supplying appropriate precursor materials, which are well known from chemical vapor deposition (CVD) based deposition techniques, the layer 105 may deposit with a specific concentration of the non-silicon species, such as germanium, while a significant deposition of material on the mask layer 104 may be suppressed. As previously explained, typically, enhanced process uniformity may be achieved by maintaining the concentration of the non-silicon species by approximately 25 percent and less, if a silicon/germanium alloy is considered. For other silicon-containing semiconductor alloys, such as silicon/tin, silicon/germanium/tin, silicon/carbon, other appropriate and well-approved parameter settings may be selected so as to obtain a highly uniform process result.

Figure 1B:
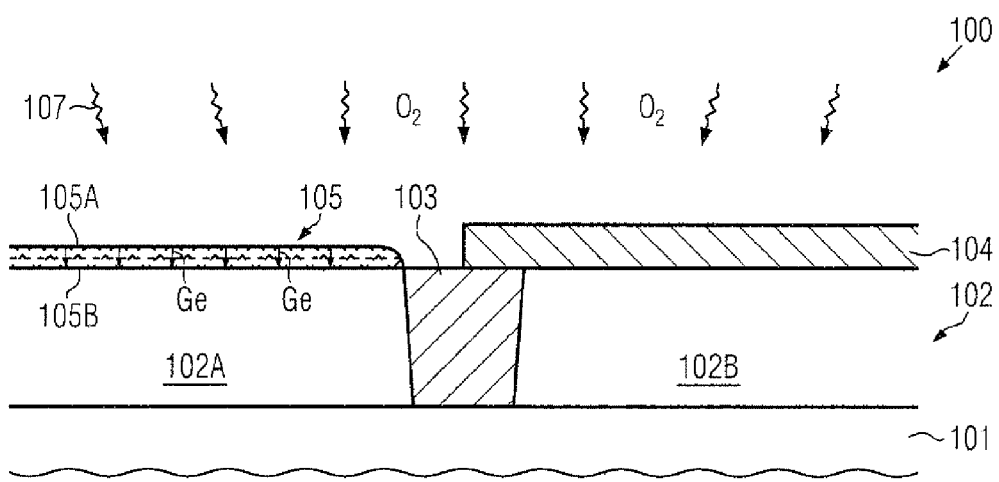

FIG. 1b schematically illustrates the semiconductor device 100 in a further advanced manufacturing stage when exposed to an oxidizing ambient 107. In some illustrative embodiments, the oxidizing ambient 107 may be established in any appropriate process tool, such as a furnace, at temperatures of approximately 900° C. and higher, so as to perform a dry oxidation process during which oxygen may diffuse into the layer 105 and may preferably react with the silicon species, thereby increasingly consuming the silicon species and forming an oxidized portion 105A, while the non-silicon species such as the germanium species may be driven out from the oxidized portion 105A and may thus diffuse into a remaining layer 105B, thereby increasing the concentration of the non-silicon species therein. It should be appreciated that the oxidation rate during the process 107 may be well controllable and may also exhibit a high degree of uniformity across the entire substrate 101, which may typically be better than the uniformity obtained by the epitaxial growth process 106 of FIG. 1a. Consequently, the oxidation process 107 may not contribute to a pronounced further process non-uniformity during the formation of an appropriate semiconductor alloy. Thus, based on the initial thickness and the parameters of the oxidation process 107, the oxidized portion 105A and thus the remaining semiconductor alloy 105B may be provided with well-controllable thickness values, while the enrichment with the non-silicon species may also be achieved in a well-controllable manner. Due to the presence of the mask 104, a significant oxidation of the active region 102B may be reliably avoided.

Figure 1C:
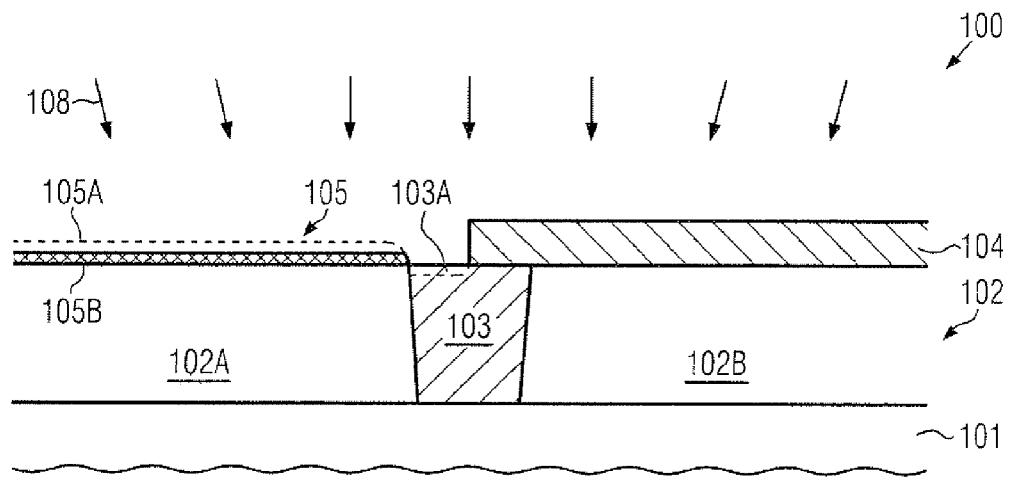

FIG. 1c schematically illustrates the semiconductor device 100 when exposed to an etch ambient 108, which may established on the basis of well-established selective etch recipes, such as hydrofluoric acid, in order to remove the portion 105A with a high degree of selectivity with respect to the remaining layer of the semiconductor alloy 105B having the increased concentration of the non-silicon species. Consequently, after removing the oxidized portion 105A, the layer 105B may have an increased germanium concentration which may be required for adjusting the threshold voltage of a transistor still to be formed in and above the active region 102A. If the thickness of the layer 105B and/or the concentration of the germanium species may require a further adaptation with respect to the desired transistor characteristics, further oxidation and removal processes, possibly in combination with a preceding additional epitaxial growth process, may be performed, as will be described later on in more detail. In other cases, when the characteristics of the layer 105B are appropriate for the threshold adjusting effect, the further processing may be continued by forming a gate electrode structure including high-k dielectric materials and metal-containing electrode materials, as will be explained later on in more detail.

In other cases, when additional process steps may be required, such as a further epitaxial growth process, the etch sequence 108 may also comprise any cleaning processes for preparing the surface of the layer 105B for a further epitaxial growth process. Furthermore, it should be appreciated that, during the etch process 108, material of the isolation structure 103 may also be removed, i.e., of an exposed portion thereof, as indicated by the dashed line 103A. A corresponding material removal may, however, not substantially affect the further processing of the device 100.

Figure 1D:
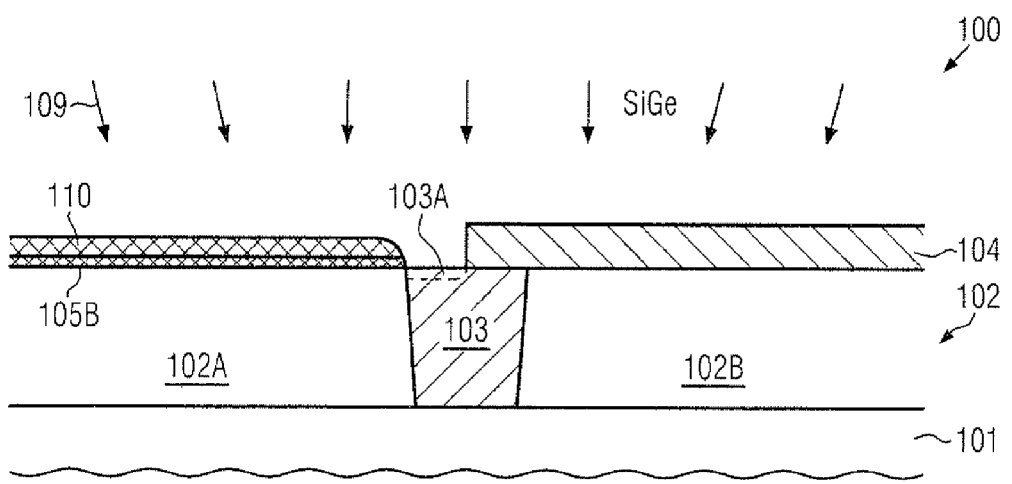
FIGS. 1d-1f schematically illustrate cross-sectional views of the semiconductor device according to further illustrative embodiments in which the sequence of depositing the semiconductor alloy, oxidizing a portion thereof and removing the oxidized portion may be repeated.

FIG. 1d schematically illustrates the semiconductor device 100 when exposed to a further selective epitaxial growth process 109, which may be performed on the basis of the same parameter setting as the process 106 of FIG. 1a. In other cases, a different parameter setting may be used when a desired degree of uniformity of the deposition process 109 may be achieved. Consequently, a further silicon-containing semiconductor alloy 110 may be formed on the previous layer 105B, wherein the characteristics of the layer 110 may also be adjusted by an oxidation and etch sequence, if required. In other cases, if a graded concentration may be required, the further processing may be performed on the basis of the layers 105B, 110 by forming an appropriate gate electrode structure.

Figure 1E:
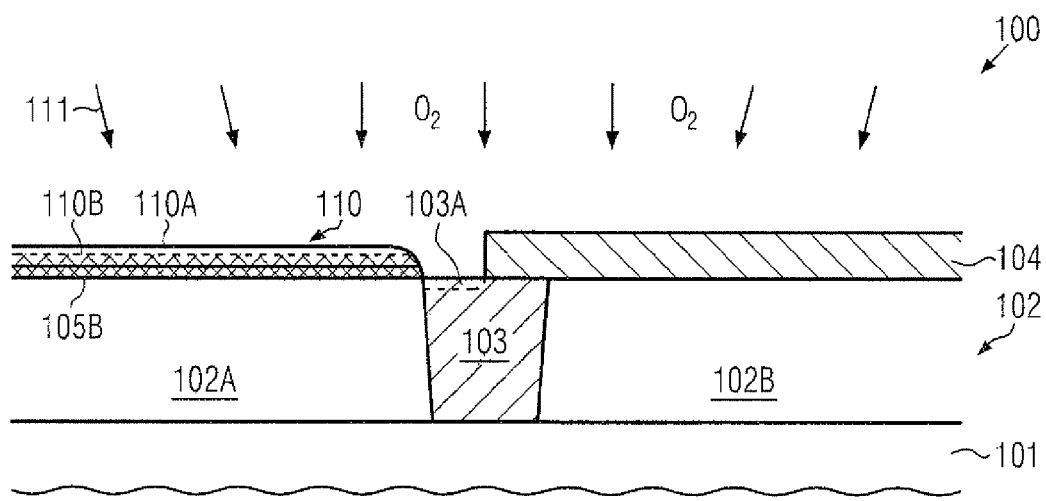

FIG. 1e schematically illustrates the semiconductor device 100 when exposed to a further oxidizing ambient 111, which may be established on the basis of similar parameter settings as described above with reference to FIG. 1b, while, in other cases, any other appropriate parameters may be selected, depending on the characteristics of the layer 110. Consequently, during the process 111, an oxidized portion 110A may be formed, thereby also modifying the material composition of a remaining portion 110B, similarly as previously explained.

It should be appreciated that, in some illustrative embodiments, one or both oxidation processes 107 (FIG. 1b) and 111 may be performed as "locally selective" anneal processes so as to enable an individual adaptation of the characteristics of the layers 105A and/or 110B. For example, laser-based or flashlight-based anneal techniques may be applied in which appropriate scan patterns or masking regimes may be used so as to locally form the oxidized portion 110A or by locally adapting the oxidation rate so as to obtain different types of layers 105B and/or 110B.

Figure 1F:
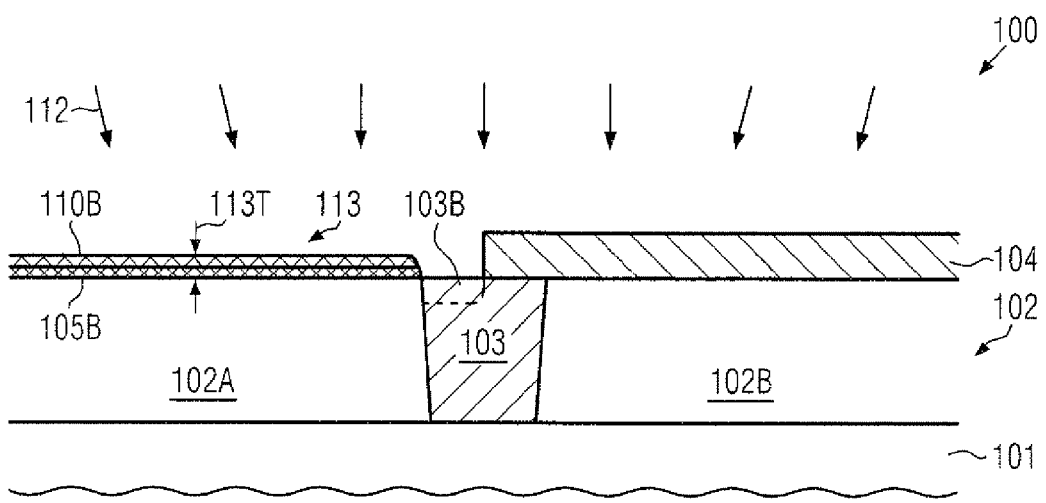

FIG. 1f schematically illustrates the semiconductor device 100 during a further etch process 112 in order to remove the oxidized portion 110A (FIG. 1e). For example, similar etch recipes may be used as previously described. Consequently, the remaining semiconductor layers 110B, 105B may form a layer of a semiconductor material 113 having a specific thickness 113T and a specific material composition as adjusted during the previous deposition, oxidation and etch sequences. For instance, the layer 113 in the form of a silicon/germanium layer may have a thickness of approximately 5-15 Å with a germanium concentration of more than 25 atomic percent, while, in other cases, any other appropriate values for the thickness 113T and the germanium concentration may be adjusted. It should further be appreciated that, due to the additional etch process 112, a further recessing of the isolation structure 103, indicated by 103B, may be created.

Figure 1G:
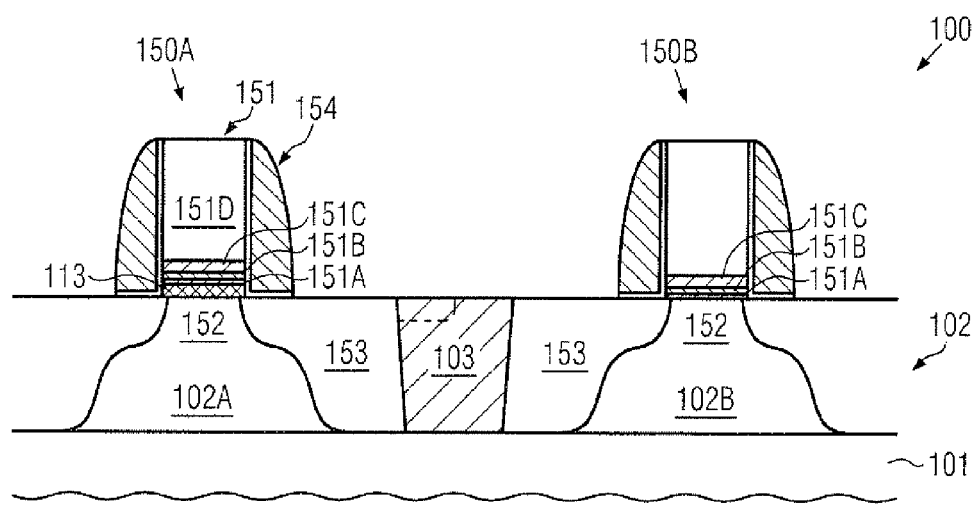
FIG. 1g schematically illustrates a cross-sectional view of the semiconductor device in a further advanced manufacturing stage in which the previously formed silicon-containing semiconductor alloy may be used as a threshold adjusting material for one type of transistor that may include a sophisticated gate electrode structure, according to still further illustrative embodiments.

FIG. 1g schematically illustrates the semiconductor device 100 in an advanced manufacturing stage. As illustrated, a first transistor 150A, such as a P-channel transistor, may be formed in and above the active region 102A, and a second transistor 150B, such as an N-channel transistor, may be formed in and above the active region 102B. The transistors 150A, 150B may comprise a gate electrode structure 151 comprising a sophisticated stack of layers, such as layers 151A, 151B and 151C, which may represent a high-k gate insulation layer, for instance in the form of the layers 151A and 151B, wherein at least one of these layers may be comprised of the material having a dielectric constant of 10.0 and higher. For instance, the layer 151A may be provided in the form of a "conventional" dielectric material, such as a silicon-containing oxide material and the like, and may provide superior interface characteristics, as previously described. For example, a thickness of 5-10 Å may be used for the layer 151A. The layer 151B may represent any appropriate high-k material, such as hafnium oxide and the like, with an appropriate thickness, for instance of approximately 10-30 Å, followed by the layer 151C, which may represent a metal-containing electrode material, such as titanium nitride, aluminum oxide and the like. Moreover, a further electrode material 151D, for instance in the form of polysilicon, germanium, a silicon/germanium mixture and the like, may be formed on the metal-containing electrode material 151C. A similar configuration may be provided in the gate electrode structure of the transistor 150B. Furthermore, the transistors 150A, 150B may comprise a channel region 152, which may be laterally enclosed by corresponding drain and source regions 153. As illustrated, the channel region 152 in the action region 102A may comprise the silicon-containing semiconductor alloy 113 having characteristics as adjusted during the previous process sequence. Furthermore, a spacer structure 154 may be formed on sidewalls of the gate electrode structure 151.

The transistors 150A, 150B may be formed on the basis of the following process techniques. After providing the layer 113 in the active region 102A and after removal of the mask layer 104 (FIG. 1f), the material layers 151A, 151B, 151C and 151D may be formed in accordance with well-established process techniques followed, by the sophisticated patterning sequence in order to obtain the gate electrode structures 151. Thereafter, appropriate implantation processes may be performed, possibly in combination with forming the spacer structure 154, in order to establish a desired dopant profile for the drain and source regions 153. Thereafter, any anneal cycles may be performed to activate the dopant species and also re-crystallize implantation-induced damage. Thereafter, the further processing may be continued, for instance by forming metal silicide regions in the drain and source regions 153 and providing an appropriate interlayer dielectric material for forming contact elements therein, wherein, if desired, additional strain-inducing mechanisms, for instance in the form of a stressed dielectric material, may be provided.

With reference to FIGS. 2a-2d, further illustrative embodiments will now be described in which, additionally or alternatively to providing a threshold adjusting semiconductor alloy, a strain-inducing semiconductor alloy may be formed adjacent to a gate electrode structure.

Figure 2A:
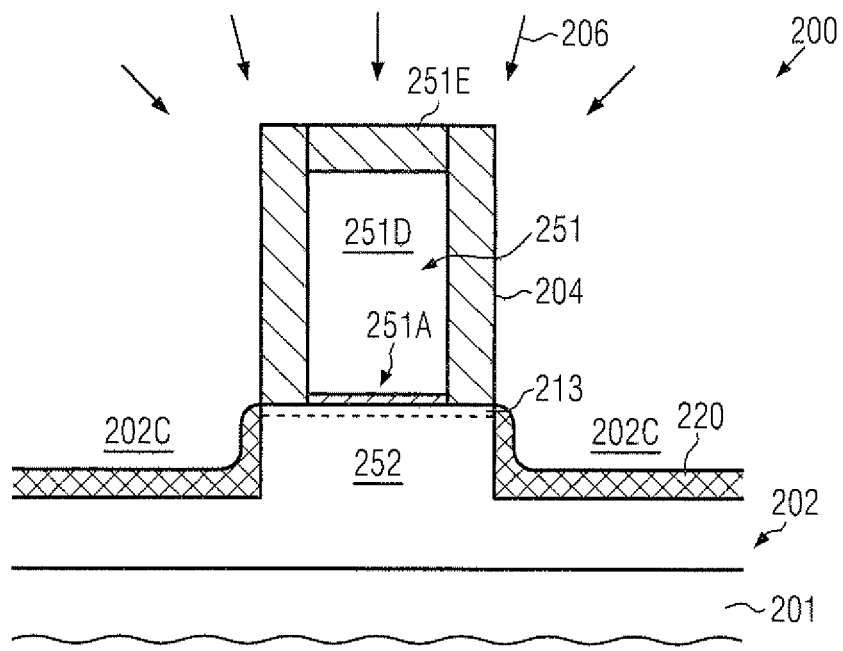
FIGS. 2a-2d schematically illustrate cross-sectional views of a semiconductor device during various manufacturing stages in which a strain-inducing semiconductor alloy may be formed on the basis of a process sequence for adjusting the concentration of a non-silicon species by oxidation and selective removal, according to illustrative embodiments, wherein a threshold adjustment may also be accomplished by the corresponding process sequence described above.

FIG. 2a schematically illustrates a semiconductor device 200 comprising a substrate 201 and a semiconductor layer 202. With respect to these components, the same criteria may apply as previously explained with reference to the device 100. Moreover, in the manufacturing stage shown, a gate electrode structure 251 may be formed on a portion of the semiconductor layer 202 and may be encapsulated by a mask material 204, for instance in the form of silicon nitride, silicon dioxide and the like. The gate electrode structure 251 may have any appropriate configuration, such as a gate insulation layer 251A in combination with an electrode material 251D. In some illustrative embodiments, the gate insulation layer 251A in combination with the electrode material 251D may represent a "conventional" gate electrode structure, that is, dielectric materials such as silicon dioxide, silicon nitride, silicon oxynitride and the like may be used for the layer 251A in combination with silicon, silicon/germanium, germanium and the like for the electrode material 251D. In other illustrative embodiments, the gate electrode structure 251 may represent a sophisticated gate electrode structure in which the gate insulation layer 251A may comprise a high-k dielectric material, as previously explained. Moreover, the electrode material 251D may comprise a metal-containing material that may be formed on the gate insulation layer 251A, as previously discussed. Furthermore, a channel region 252 may represent a silicon material, while, in other cases, additionally, a threshold adjusting semiconductor alloy 213 may be provided and may have appropriately adjusted characteristics in view of obtaining a desired band gap offset, as previously explained. Moreover, cavities 202C are formed in the semiconductor layer 202 laterally offset from the gate electrode structure 251. Furthermore, a first layer of strain-inducing semiconductor alloy 220, such as a silicon/germanium alloy, may be formed in the cavities 202C. The semiconductor alloy 220 may have a concentration of a non-silicon species, which may be adapted on the basis of subsequent process steps, while not unduly contributing to increased crystal defects and the like.

The semiconductor device 200 as shown in FIG. 2a may be formed on the basis of the following processes. After defining corresponding active regions on the basis of an isolation structure, as previously discussed with reference to the device 100, if required, the threshold adjusting semiconductor alloy 213 may be formed, wherein, in some illustrative embodiments, at least one deposition, oxidation and etch cycle may be used so as to adjust the overall characteristics of the material 213, as previously described with reference to the semiconductor device 100. In other cases, the material 213 may not be provided and the further processing may be continued by forming the gate electrode structure 251, which may be appropriately encapsulated by providing a cap layer 251E in combination with the spacers 204. Thereafter, an etch process may be performed in order to obtain the cavities 202C and, after preparing the exposed surface portion, a selective epitaxial growth process 206 may be performed in order to provide the layer 220 having specific characteristics with respect to thickness, material composition and the like, as previously explained. Thus, an appropriate parameter setting for the process 206 may be selected so as to obtain the layer 220 with a high degree of uniformity and a reduced defect rate, while other parameters such as the overall germanium concentration, if a silicon/germanium alloy is considered, may be adjusted in a later manufacturing stage.

Figure 2B:
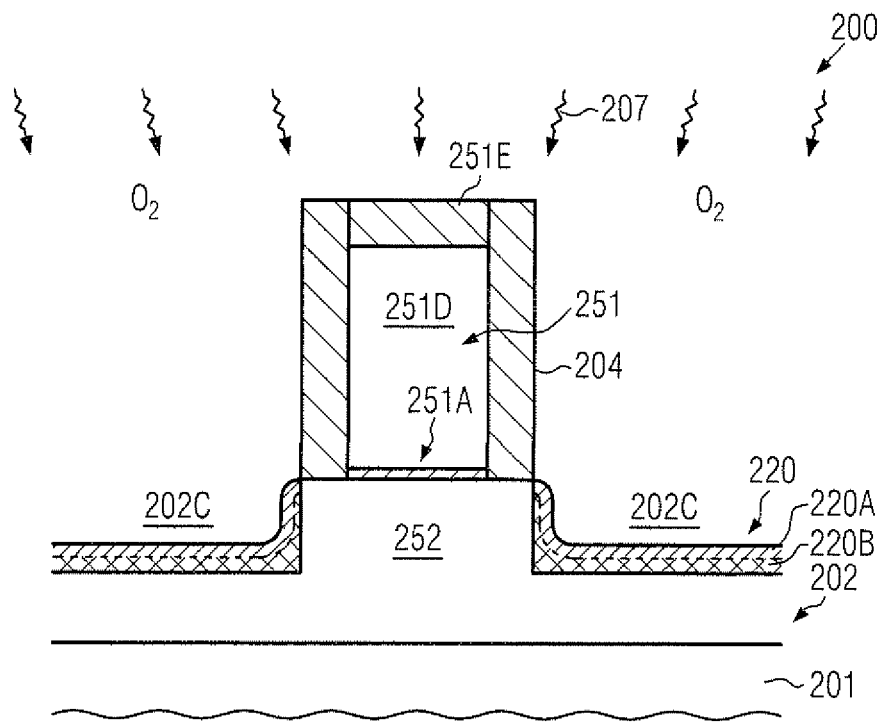

FIG. 2b schematically illustrates the semiconductor device when exposed to an oxidizing ambient 207 in which a portion 220A of the layer 220 may be oxidized, while preserving a portion 220B, which may thus have modified characteristics, for instance with respect to the concentration of a non-silicon species.

Figure 2C:
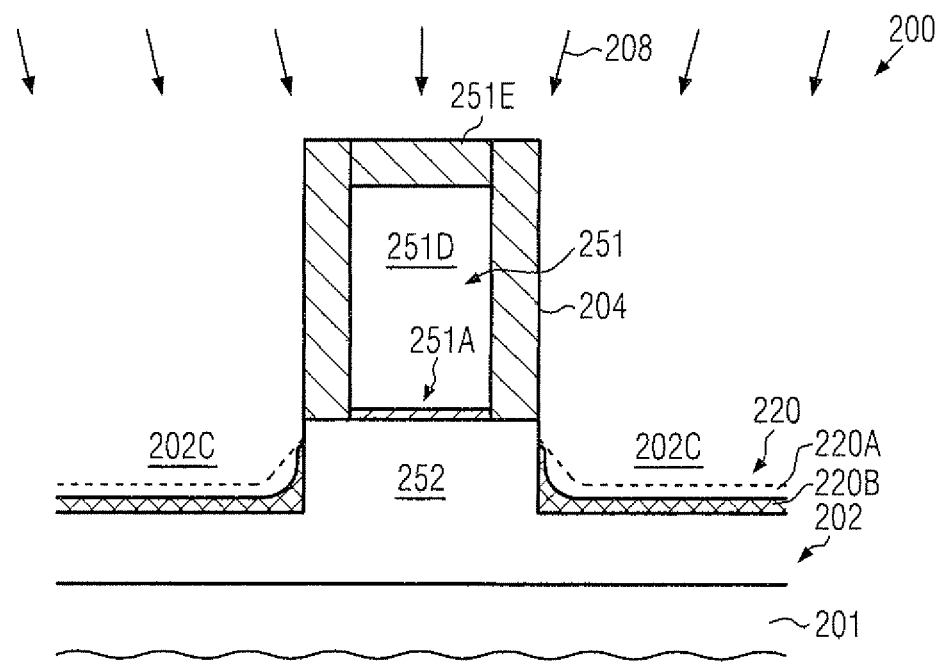

FIG. 2c schematically illustrates the semiconductor device 200 during an etch process 208 for selectively removing the portion 220A while substantially maintaining the semiconductor alloy 220B. For instance, similar etch recipes may be used, as previously explained with reference to the device 100.

Figure 2D:
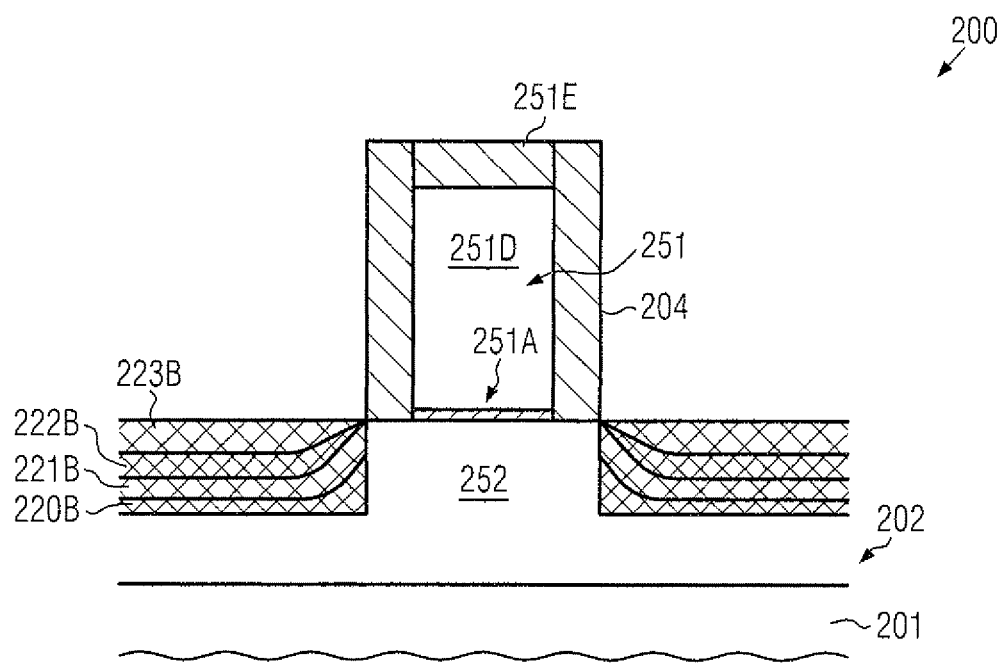

FIG. 2d schematically illustrates the semiconductor device 200 in a further advanced manufacturing stage. As illustrated, one or more additional layers of the strain-inducing semiconductor alloy, indicated as 221B, 222B, 223B, may be formed in the cavities 202C (FIG. 2c). It should be appreciated that the layers 221B, 222B, 223B may have similar characteristics in view of material composition as the layer 220B, while, in other cases, different characteristics may be adjusted, for instance by applying a process sequence described above for only some of the layers 221B, 222B, 223B, or by selecting different process parameters, for instance during the oxidation process and the like. Thus, a high degree of flexibility in adjusting the overall material characteristics within the cavities 202C on the basis of a strain-inducing semiconductor alloy may be achieved, wherein, nevertheless, a high degree of process uniformity may be ensured by using a basic deposition process having a superior process uniformity. That is, each of the individual semiconductor layers may be deposited on the basis of a desired parameter setting of the selective epitaxial growth process and, if required, the material composition of one or more of these layers may be appropriately adjusted by applying an oxidation and etch cycle, as described above. In this case, an increased degree of germanium concentration may be accomplished, at least in some areas, within cavities 202C without introducing significant lattice defects or differing from superior process non-uniformities, as may typically be the case in conventional process strategies in which the germanium concentration may be increased in a selective epitaxial growth process.

Thereafter, the processing of the device 200 may be continued by removing the spacer 204 and the cap layer 251E and forming drain and source regions, as is previously described with reference to the semiconductor device 100.

As a result, the present disclosure provides techniques for varying the characteristics of a silicon-containing semiconductor alloy in a highly controllable manner by using a stable and uniform deposition recipe for a selective epitaxial growth process and performing at least one oxidation and etch cycle for modifying the characteristics, for instance increasing the germanium concentration in a silicon/germanium alloy. In this manner, enhanced flexibility may be accomplished, for instance, for providing a threshold adjusting silicon/germanium alloy and/or providing a strain-inducing semiconductor alloy in drain and source areas of sophisticated transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of a first silicon-containing semiconductor alloy on a silicon-containing crystalline semiconductor region, said first silicon-containing semiconductor alloy comprising a non-silicon species with a first concentration;
   forming an oxide by consuming material of an upper layer portion of said layer of said first silicon-containing semiconductor alloy while preserving a lower layer portion of said layer of said first silicon-containing semiconductor alloy on said silicon-containing crystalline semiconductor region, wherein forming said oxide comprises changing a concentration of said non-silicon species in said lower layer portion of said layer of said first silicon-containing semiconductor alloy from said first concentration to a second concentration;
   removing said oxide from said lower layer portion of said layer of said first silicon-containing semiconductor alloy; and
   after removing said oxide, forming a transistor in and above said crystalline semiconductor region so that a channel region of said transistor is positioned in said lower layer portion of said layer of said first silicon-containing semiconductor alloy having said second concentration of said non-silicon species, said transistor comprising a gate electrode structure, said gate electrode structure comprising a high-k dielectric gate insulation layer and a metal-containing gate electrode material formed above said high-k dielectric gate insulation layer.

2. The method of claim 1, wherein said non-silicon species comprises germanium.

3. The method of claim 1, further comprising forming a layer of a second silicon-containing semiconductor alloy on said lower layer portion of said layer of said first silicon-containing semiconductor alloy, forming an oxide by consuming material of an upper layer portion of said layer of said second silicon-containing semiconductor alloy while preserving a lower layer portion of said layer of said second silicon-containing semiconductor alloy on said lower layer portion of said layer of said first silicon-containing semiconductor alloy.

4. The method of claim 1, wherein forming an oxide comprises performing an oxidation process at a process temperature of approximately 900° C. and higher.

5. The method of claim 1, wherein a thickness of said lower layer portion of said layer of said first silicon-containing semiconductor alloy is approximately 10 Å or less.

6. The method of claim 1, wherein said non-silicon species is germanium and said first concentration is approximately 25 atomic percent or less.

7. The method of claim 1, further comprising forming a mask layer above a second silicon-containing crystalline semiconductor region, wherein said layer of said first silicon-containing semiconductor alloy and said oxide are formed in the presence of said mask layer.

8. The method of claim 7, wherein said mask layer comprises a non-oxidizable material.

9. The method of claim 7, further comprising forming a second gate electrode structure of a second transistor above said second silicon-containing crystalline semiconductor region, said second gate electrode structure comprising a high-k dielectric gate insulation layer and a metal-containing gate electrode material formed above said high-k dielectric gate insulation layer.

10. The method of claim 9, wherein said transistor is a P-channel transistor and said second transistor is an N-channel transistor.

11. The method of claim 1, further comprising forming cavities in said silicon-containing crystalline semiconductor region laterally offset from said gate electrode structure and forming a strain-inducing semiconductor alloy in said cavities.

12. The method of claim 11, wherein forming said strain-inducing semiconductor alloy comprises forming a first layer of said strain-inducing semiconductor alloy, oxidizing a portion of said first layer of said strain-inducing semiconductor layer and removing said portion to form a second layer of strain-inducing semiconductor alloy.

13. A method, comprising:
    forming a first layer of a silicon/germanium alloy on a silicon-containing semiconductor region, said first layer comprising a germanium species with a first concentration;
    oxidizing an upper layer portion of said first layer so as to increase a concentration of said germanium species in a lower layer portion of said first layer from said first concentration to a second concentration that is higher than said first concentration;
    removing said oxidized upper layer portion of said first layer selectively to said lower layer portion of said first layer; and
    after removing said oxidized upper layer portion, forming a transistor element in and above said silicon-containing semiconductor region, wherein a channel region of said transistor element is positioned in said lower layer portion of said first layer having said increased concentration of germanium.

14. The method of claim 13, wherein forming said transistor element comprises forming a gate electrode structure above said lower layer portion of said first layer and using said lower layer portion of said first layer to adjust a threshold of said transistor element.

15. The method of claim 13, further comprising forming a cavity in said silicon-containing semiconductor region laterally offset from a gate electrode structure and forming said first layer of a silicon/germanium alloy in said cavity.

16. The method of claim 13, further comprising forming a second layer of a silicon/germanium alloy on said lower layer portion of said first layer, oxidizing an upper layer portion of said second layer and removing said upper layer portion of said second layer selectively a lower layer portion of said second layer.

17. The method of claim 13 wherein said first concentration is approximately 25 atomic percent or less.

18. The method of claim 14, wherein said lower layer portion of said first layer has a thickness of approximately 10 Å or less.

19. The method of claim 18, wherein forming said gate electrode structure comprises forming a high-k dielectric material above said lower layer portion of said first layer.

20. A method, comprising:
    forming a first material layer on a silicon-containing semiconductor region, wherein said first material layer comprises a silicon/germanium semiconductor alloy having a first concentration of germanium, said first material layer having a lower layer portion and an upper layer portion on said lower layer portion;

increasing a concentration of germanium in said lower layer portion from said first concentration to a second concentration, wherein increasing said concentration of germanium in said lower layer portion to said second concentration comprises driving at least a portion of said germanium in said upper layer portion into said lower layer portion;

removing said upper layer portion from said lower layer portion; and after removing said upper layer portion from said lower layer portion, forming a transistor element in and above said silicon-containing semiconductor region, wherein a channel region of said transistor element is positioned in said lower layer portion of said first material layer having said increased concentration of germanium.

21. The method of claim 20, wherein driving said at least said portion of said germanium in said upper layer portion into said lower layer portion comprises performing an oxidation process to oxidize said upper layer portion.

22. The method of claim 20, further comprising forming a second material layer on said lower layer portion of said first material layer, wherein said second material layer comprises a silicon/germanium semiconductor alloy having a third concentration of germanium, said second material layer having a lower layer portion and an upper layer portion on said lower layer portion of said second material layer.

23. A method, comprising:

forming a layer of a first silicon-containing semiconductor alloy on a silicon-containing crystalline semiconductor region, said first silicon-containing semiconductor alloy comprising a non-silicon species with a first concentration;

forming a first oxide by consuming material of an upper layer portion of said layer of said first silicon-containing semiconductor alloy while preserving a lower layer portion of said layer of said first silicon-containing semiconductor alloy on said silicon-containing crystalline semiconductor region, wherein forming said first oxide comprises changing a concentration of said non-silicon species in said lower layer portion of said layer of said first silicon-containing semiconductor alloy from said first concentration to a second concentration;

removing said first oxide from said lower layer portion of said layer of said first silicon-containing semiconductor alloy;

forming a layer of a second silicon-containing semiconductor alloy on said lower layer portion of said layer of said first silicon-containing semiconductor alloy;

forming a second oxide by consuming material of an upper layer portion of said layer of said second silicon-containing semiconductor alloy while preserving a lower layer portion of said layer of said second silicon-containing semiconductor alloy on said lower layer portion of said layer of said first silicon-containing semiconductor alloy; and after removing at least said first oxide, forming a gate electrode structure of a transistor above at least said lower layer portion of said layer of said first silicon-containing semiconductor alloys, said gate electrode structure comprising a high-k dielectric gate insulation layer and a metal-containing gate electrode material formed above said high-k dielectric gate insulation layer.

24. The method of claim 23, wherein said layer of said second silicon-containing semiconductor alloy comprises said non-silicon species and is formed after removing said first oxide, wherein forming said second oxide comprises increasing a concentration of said non-silicon species in said lower layer portion of said layer of said second silicon-containing semiconductor alloy, wherein said second oxide is removed prior to forming said gate electrode structure, and wherein said gate electrode structure is formed above said lower layer portion of said layer of said second silicon-containing semiconductor alloy.

25. A method, comprising:

forming a first material layer on a silicon-containing semiconductor region, wherein said first material layer comprises a silicon/germanium semiconductor alloy having a first concentration of germanium, said first material layer having a lower layer portion and an upper layer portion on said lower layer portion;

increasing a concentration of germanium in said lower layer portion of said first material layer from said first concentration to a second concentration;

removing said upper layer portion of said first material layer from said lower layer portion of said first material layer;

forming a second material layer on said lower layer portion of said first material layer, wherein said second material layer comprises a silicon/germanium semiconductor alloy having a third concentration of germanium, said second material layer having a lower layer portion and an upper layer portion on said lower layer portion of said second material layer;

after removing said upper layer portion from said lower layer portion, forming a transistor element in and above said silicon-containing semiconductor region, wherein a channel region of said transistor element is positioned in said lower layer portion of said first material layer having said increased concentration of germanium.

26. The method of claim 25, further comprising increasing a concentration of germanium in said lower layer portion of said second material layer from said third concentration to a fourth concentration, and removing said upper layer portion of said second material layer from said lower layer portion of said second material layer.

27. The method of claim 26, wherein increasing said concentration of germanium in said lower layer portion of said second material layer to said fourth concentration comprises performing an oxidation process to drive at least a portion of said germanium in said upper layer portion of said second material layer into said lower layer portion of said second material layer.

* * * * *